United States Patent
Wada et al.

(10) Patent No.: US 6,576,567 B1
(45) Date of Patent: Jun. 10, 2003

(54) FILM DEPOSITION METHOD AND APPARATUS FOR SEMICONDUCTOR DEVICES

(75) Inventors: Yuichi Wada, Narita (JP); Hiroyuki Yarita, Narita (JP); Hisashi Aida, Narita (JP); Naomi Yoshida, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,610

(22) PCT Filed: Oct. 29, 1999

(86) PCT No.: PCT/JP99/06034

§ 371 (c)(1),
(2), (4) Date: Apr. 30, 2001

(30) Foreign Application Priority Data

Oct. 29, 1998 (JP) ............................................ 10-308666

(51) Int. Cl.[7] .............................................. H01L 21/31
(52) U.S. Cl. ...................... 438/780; 438/710; 438/761; 438/763; 438/99; 427/96; 427/99; 427/497; 118/715; 118/72; 118/73
(58) Field of Search ................................ 438/780, 710, 438/763, 761, 93, 94, 95, 99, 785, 790, 681, 765; 257/750, 763, 774; 427/229, 97, 306, 255, 28, 576; 118/715

(56) References Cited

U.S. PATENT DOCUMENTS

| | | | | | |
|---|---|---|---|---|---|
| 4,512,855 A | * | 4/1985 | Mazur | ......................... | 205/164 |
| 4,601,914 A | * | 7/1986 | Barnes et al. | ................. | 257/414 |
| 4,649,859 A | * | 3/1987 | Wanlass | ...................... | 118/715 |
| 4,780,334 A | * | 10/1988 | Ackerman | ................... | 427/109 |
| 4,830,880 A | * | 5/1989 | Okubi et al. | ................. | 427/229 |
| 4,988,632 A | * | 1/1991 | Pfiester | ................. | 148/DIG. 123 |
| 5,462,014 A | * | 10/1995 | Awaya et al. | ................ | 118/715 |
| 5,618,580 A | * | 4/1997 | Oshima et al. | .............. | 118/715 |
| 5,650,361 A | * | 7/1997 | Radhakrishnan | ... | 148/DIG. 113 |
| 5,755,886 A | * | 5/1998 | Wang et al. | ................. | 118/715 |
| 5,882,368 A | * | 3/1999 | Falcony-Guajardo et al. | ........................... | 427/160 |
| 5,920,798 A | * | 7/1999 | Higuchi et al. | ............. | 438/761 |
| 5,939,201 A | * | 8/1999 | Boire et al. | ................. | 359/839 |
| 5,968,594 A | * | 10/1999 | Hu et al. | .................. | 427/248.1 |
| 6,033,732 A | * | 3/2000 | Yuuki et al. | ............. | 204/192.2 |
| 6,074,487 A | * | 6/2000 | Yoshioka et al. | ........... | 118/715 |
| 6,096,133 A | * | 8/2000 | Yuuki et al. | ................. | 118/708 |
| 6,179,920 B1 | * | 1/2001 | Tarutani et al. | ............. | 118/715 |
| 6,241,858 B1 | * | 6/2001 | Phillips et al. | .............. | 118/716 |

(List continued on next page.)

FOREIGN PATENT DOCUMENTS

| | | | | |
|---|---|---|---|---|
| JP | 4-53132 | 2/1992 | | |
| JP | 8-274012 | 10/1996 | | |
| JP | 9-45773 | 2/1997 | | |
| JP | 9-302471 | 11/1997 | | |
| JP | 10-135154 | 5/1998 | ......... | H01L/21/285 |
| JP | 10-140352 | 5/1998 | ........... | C23C/16/18 |

Primary Examiner—Matthew Smith
Assistant Examiner—Victor Yeusikov
(74) Attorney, Agent, or Firm—Moser, Patterson & Sheridan, LLP

(57) ABSTRACT

In a film deposition method of depositing a film by adhering an organometallic fluid onto a to-be-processed body such as a semiconductor wafer and causing a pyrolytic decomposition reaction to occur, an organic solvent such as heptadecane is first applied onto the wafer. At this time, since heptadecane has favorable wettability to the wafer, it efficiently permeates over the entire wafer and flows into holes and trenches without an occurrence of bubbles. Next, an organic metal such as a fluid mainly containing, for example, $(hfac)Cu^{+1}(tmvs)$ is applied onto wafer W. At this time, since the heptadecane that is first applied is a solvent for the organic metal, the organometallic fluid is highly adaptive to heptadecane, it efficiently permeates over the entire wafer W, and evenly flows into holes etc. This allows filling-in to be performed without the development of vacancies.

10 Claims, 3 Drawing Sheets

U.S. PATENT DOCUMENTS 6,280,518 B1 * 8/2001 Itsuki et al. ............ 106/287.19
6,284,652 B1 * 9/2001 Charneski et al. .......... 438/653
6,316,055 B1 * 11/2001 Desu et al. ............ 427/255.28
6,332,928 B2 * 12/2001 Shealy et al. ............... 118/708
6,355,097 B2 * 3/2002 Itsuki et al. ............ 106/287.19
6,413,581 B1 * 7/2002 Greenberg et al. ..... 204/192.12
6,428,623 B2 * 8/2002 Westmoreland et al. .... 118/715

* cited by examiner

FILM DEPOSITION METHOD AND APPARATUS FOR SEMICONDUCTOR DEVICES

TECHNICAL FIELD

The present invention relates to fabrication process techniques, for example, semiconductor devices and the like. In particular, it relates to techniques for performing film deposition using fluids that have an organometallic compound as the main component (organometallic fluids).

BACKGROUND ART

In recent years, demands for further integration and miniaturization of the semiconductor devices have increased. In response to these demands, there has been a remarkable switch from aluminum-based materials to copper-based materials being used as interconnect material or line material in the film deposition process of manufacturing semiconductor devices.

A method of depositing a film using a material containing such types of copper, that has been put into practice includes, for example, metalorganic chemical vapor deposition (MOCVD), which is performed by vaporizing an organometallic compound (that is usually fluid at room temperature and under normal pressure) such as $(hfac)Cu^{+1}(tmvs)$, introducing it to the process chamber, and causing a pyrolytic decomposition reaction to occur on a wafer being held in said process chamber so that a thin film can be deposited.

Such conventional MOCVD processes thus provide superb step coverage and are extremely effective in the fabrication of very thin films. However, with these MOCVD processes, at times when it is necessary to guarantee a certain layer thickness, for example during the step of filling in contact holes, problems develop due to the lack of accuracy. It takes time to fill in the hole completely since there is a limit to the thickness of the layer that can be accumulated within a certain length of time due to the low amounts of the organometallic compound itself existing in the process chamber, which results from the low pressure in the process chamber. There is an additional danger of the vaporized organometallic compound reacting inside the supply pipeline and clogging the pipes.

Accordingly, the present invention aims to provide a film deposition method and apparatus, which use an organometallic fluid that can deposit a film with superb filling-in characteristics.

DISCLOSURE OF THE INVENTION

In order to fulfill the objective mentioned above, the inventors considered many variables. As a result, they found that the pyrolytic decomposition reaction of organometallic fluid occurs by heating it even if it does not vaporize, thus resulting in film formation. From this, the inventors considered methods of applying organometallic fluid while heating the wafer; however, with this method, they came to the conclusion that it is difficult to flow in the organometallic fluid entirely into holes and trenches, such as the contact holes that are microstructured on the surface of the semiconductor wafer resulting in a development of vacancies in the holes.

Accordingly, a film deposition method of depositing a film by adhering an organometallic fluid onto a to-be-processed body such as a semiconductor wafer, and subjecting it to a pyrolytic decomposition reaction, is characterized by the first step of adhering a solvent, which is used to mix with an organometallic compound, onto a to-be-processed body and adhering the organometallic fluid onto said to-be-processed body after the first step is finished.

In this manner, when the organometallic compound is adhered onto the to-be-processed body while the surface of the to-be-processed body is being wet with the solvent that is mixed with the organometallic compound, said fluid is highly adaptive to the solvent that has been adhered, permeating over the entire area. Accordingly, the fluid containing the organometallic compound evenly flows into the holes and trenches microstructured on the to-be-processed body. Therefore, the possibility that vacancies develop in the minute pattern is very low, so that it is possible to deposit a film with favorable filling-in characteristics.

It is noted here that 'adhesion' represents a broad idea that includes cases where a to-be-processed body is immersed into a fluid; cases where it is atomized and then applied to the body; or cases where it is applied using a roller, etc.

In the above film deposition method, the organometallic fluid may be of solely an organometallic compound; alternatively it may be a mixture of an organometallic compound and a solvent added to it. In this case, the solvent that is used by itself in the first step may be used to generate the organometallic fluid.

A copper-ketonato metal complex, for example, is used as the organometallic compound, and an aliphatic saturated hydrocarbon is used as a solvent that is mixed with the organometallic compound.

Furthermore, a film deposition apparatus, according to the present invention, which is suitable for the implementation of the above-mentioned film deposition method, is comprised of organometallic fluid adhering means, which adheres a fluid that is mixed with an organometallic compound onto a to-be-processed body; organometallic fluid adhering means, which adheres a fluid including an organometallic compound onto the to-be-processed body; and control means, which controls the solvent adhering means and the organometallic fluid adhering means so as to adhere the solvent onto the to-be-processed body and then adhere the organometallic fluid onto the to-be-processed body.

BEST MODE FOR CARRYING OUT THE INVENTION

In the following, a preferred embodiment according to the present invention will be described while referencing the Figures.

Figure 1:
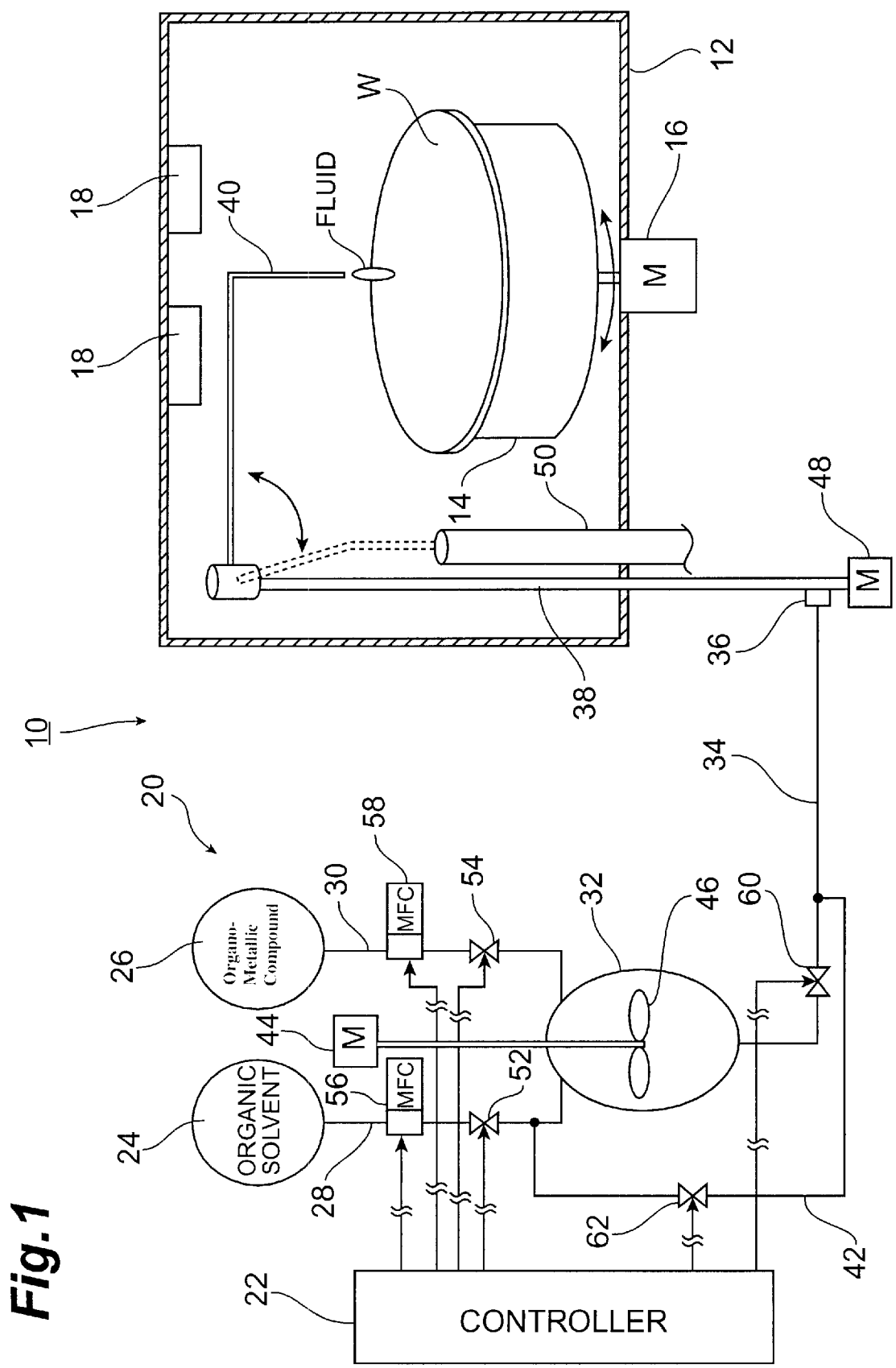
FIG. 1 shows an outline of an embodiment of a film deposition apparatus, according to the present invention.

FIG. 1 shows an outline of the first embodiment of a film deposition apparatus, according to the present invention. In FIG. 1, film deposition apparatus 10 is comprised of process chamber 12, in which turntable 14 that is a means for supporting a to-be-processed body or semiconductor wafer W is located. This turntable 14, which has wafer W held by an applicable means such as a vacuum chuck, is rotationally driven by drive motor 16, which is configured external to process chamber 12. Also, a ring-shaped clamp (not shown in the Figures), which clamps the rim of wafer W, is provided on this turntable 14. The reason why the clamp is provided is because the formation of film on the rim of wafer W may have such undesired effect as causing particlization. Also, inside process chamber 12, a plurality of heating lamps 18 such as halogen lamps are installed so that wafer W, which is mounted on turntable 14, can be heated.

Also, film deposition apparatus 10 is comprised of fluid adhering device 20, which adheres a mixture of an organic solvent and an organometallic compound added to said organic solvent, or an organometallic fluid to the surface of wafer W, and controller 22, which controls fluid adhering device 20. Heptadecane is used for the organic solvent, and (hfac)Cu$^{+1}$(tmvs), which is in a liquid state under normal pressure at room temperature, is used for the organometallic compound.

Fluid adhering device 20 is made up of first tank 24, which is stored with the organic solvent described above, and second tank 26, which is stored with the organometallic compound described above. First and second tanks 24 and 26 are connected via the respective pipelines 28 and 30 to mixing tank 32. This mixing tank 32 is further connected via pipeline 34 and joint 36 such as a hose to pipeline 38. Supply pipeline 38 extends upwards into process chamber 12. Nozzle 40 extends horizontally from the upper terminal of this supply pipeline 38 and has its end facing downward. Fluid adhering device 20 is further made up of bypass pipeline 42, which connects supply pipeline 28 to supply pipeline 34 and which bypasses mixing tank 32.

Inside mixing tank 32, a pair of mixing blades 46 are configured so that it may be rotationally driven by drive motor 44, mixing the organic solvent or heptadecane stored in first tank 24 and the organometallic compound or (hfac)Cu$^{+1}$(tmvs) stored in second tank 26.

The drive motor 48 causes supply pipeline 38 to rotationally drive, allowing the end of nozzle 40 to rotate about the center axis of supply pipeline 38. It is noted here that drainpipe 50 is configured to be directly under a predetermined location along the route nozzle 40 travels, and fluid that drips from nozzle 40 is collected by drainpipe 50, whereby it becomes reusable.

Along supply pipelines 28 and 30, open/close valves 52 and 54, and mass flow rate regulating devices (MFC) 56 and 58, which regulate the organic solvent supplying rate, are provided respectively in the order beginning from the side of mixing tank 32. Also, open/close valve 60 is provided for pipeline 34, and open/close valve 62 is provided for pipeline 42. It is noted here that these open/close valves 52, 54, 60, and 62 are electromagnetically driven by controller 22. MFCs 56 and 58 are controlled in conformity with the signal output from controller 22 so that they supply predetermined amounts of the respective organic solvent and organometallic compound.

Upon reception of an instruction for supplying the organic solvent from a manual switch, not shown in the Figures, an off-signal is output to open/close valves 54 and 60 closing them, and an on-signal is output to open/close valves 52 and 62 opening them, in order for only the organic solvent to be applied to the surface of wafer W. And when, based on the measurement by, for example, an embedded timer, it is detected that a predetermined time has passed, an off-signal is output to open/close valve 62 and an on-signal is output to open/close valve 54 by the conditions mentioned above, so that it can be ready to apply a mixture of an organometallic compound and a solvent added to it (hereafter, referred to as a film deposition fluid) on wafer W.

With film deposition apparatus 20 structured in the manner as described above, a film deposition method of forming a thin film on the surface of wafer W will be described.

First, wafer W is mounted on turntable 14 by a carrying device, not shown in the Figures, and drive motor 16 is then activated to cause turntable 14 to rotate at a certain rotating speed. At this time, in order to prevent oxidation and/or another reaction of the surface of wafer W to occur, it is preferable that an inert gas such as a nitrogen gas be supplied into process chamber 12, forming an inert gas atmosphere inside of said process chamber 12.

It is assumed that wafer W used here is configured with a multilayered structure as shown in FIGS. 2A through 2D, namely dual damascene construction. This wafer W has a configuration with barrier metal layer 66 made of tantalum (Ta) on silicon oxide (SiO2) film 64, which is on silicon (Si) base 62 (see FIG. 2A). The deposition of this barrier metal layer 66 is necessary to prevent a copper (Cu) component contained in the film deposition fluid from diffusing into SiO2 layer 64, and further into Si base 62 when the film deposition fluid is applied to the surface of wafer W. It is noted here that barrier metal layer 66 is not limited to Ta, and it may be made of tantalum nitride (TaN), titanium nitride (TiN), or tungsten nitride (WN).

Figure 2A:
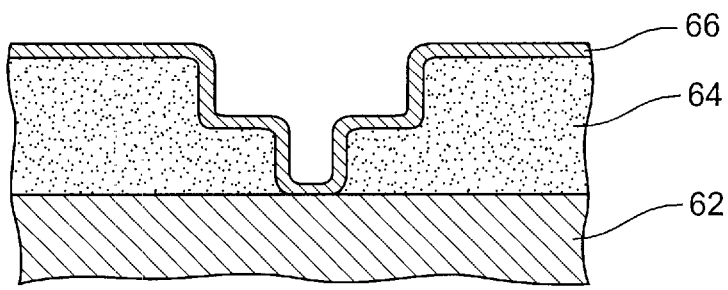
FIGS. 2A through 2D are an outline of partial cross-sectional views showing the procedures for depositing films on a semiconductor wafer through a film deposition method according to the present invention.
Figure 2B:
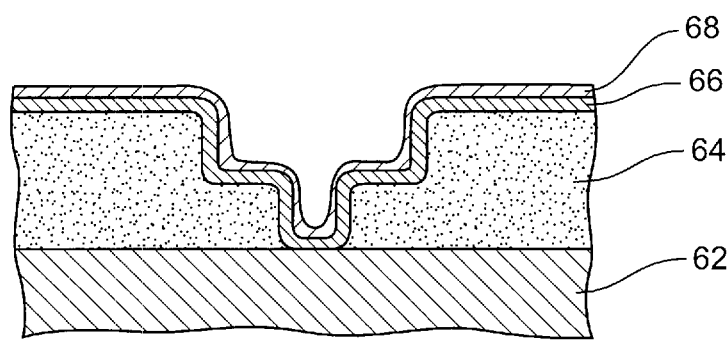
Figure 2C:
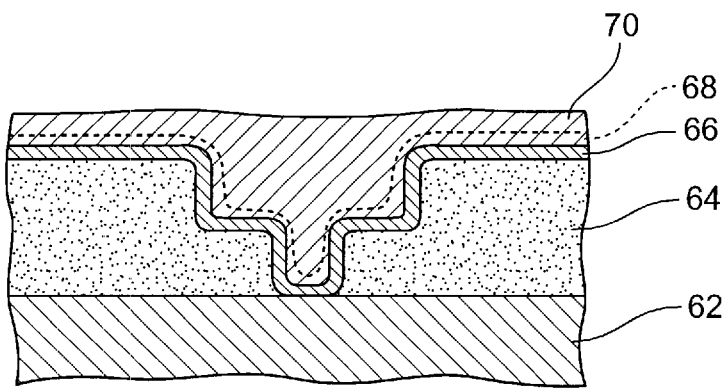
Figure 2D:
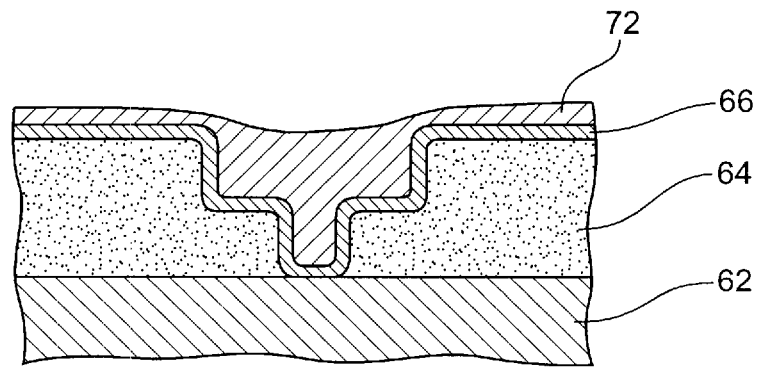

Afterwards, controller 22 issues an on-signal to open/close valves 52 and 62 opening them while open/close valves 54 and 60 are in their closed initial state, the organic solvent stored in first tank 24 is sent to nozzle 40 via supply pipeline 28, bypass pipeline 42, and supply pipelines 34 and 38, and only the organic solvent drips from the end of nozzle 40. At this time, since turntable 14 is rotating at a relatively high speed, the organic solvent applied onto wafer W radiates outward towards its rim due to the centrifugal force so that heptadecane layer 68 may be deposited (FIG. 2B).

Since the wettability of the Ta film that makes up barrier metal layer 66, which is an under layer, is much better than that of (hfac)Cu$^{+1}$(tmvs), heptadecane, which is an organic solvent, efficiently spreads out over the entire surface of wafer W. Because of the higher wettability of heptadecane than that of Ta, a sufficient amount of heptadecane is allowed to flow into holes and trenches and prevents bubbles, etc. from occurring in the holes.

Incidentally, after an ultrasonic vibration is applied to turntable 14 and/or wafer W, or heptadecane is applied on the surface of wafer W, a sponge-like roller pad, etc. comes into contact with wafer W and moves horizontally so that heptadecane can efficiently spread over the entire surface of wafer W and flow into holes, etc.

Thereafter, controller 22 controls open/close valve 62 to close it and at the same time open/close valves 54 and 60 to open them, so that heptadecane, which is stored in first tank 24, and (hfac)Cu$^{+1}$(tmvs)which is stored in second tank 26, are sent to mixing tank 32 via supply pipelines 28 and 30. The mixing blades 46 then mixes them into a process fluid or an organometallic fluid, which is then sent to nozzle 40 via supply pipelines 34 and 38 and drips from the end of nozzle 40.

At this time, since the heptadecane that is first applied is a solvent, the organometallic fluid is highly adaptive to heptadecane layer 68. Accordingly, with heptadecane layer 68 as an application accelerant, the organometallic fluid spreads over the entire surface of wafer W. As a result, a film of the organometallic fluid with uniform thickness and quality is adhered to the entire surface of wafer W. Besides, since heptadecane has adhered to the sides of holes and/or trenches, the organometallic fluid flows into all the holes, and accordingly the holes are filled without any vacancies. The organometallic fluid then diffuses into the heptadecane, resulting in heptadecane layer 68 being absorbed into the organometallic fluid. Namely, the heptadecane layer has vanished and the result of this is the same as that of where organometallic fluid layer 70 is deposited directly on barrier metal layer 66 (see FIG. 2C).

Figure 3:
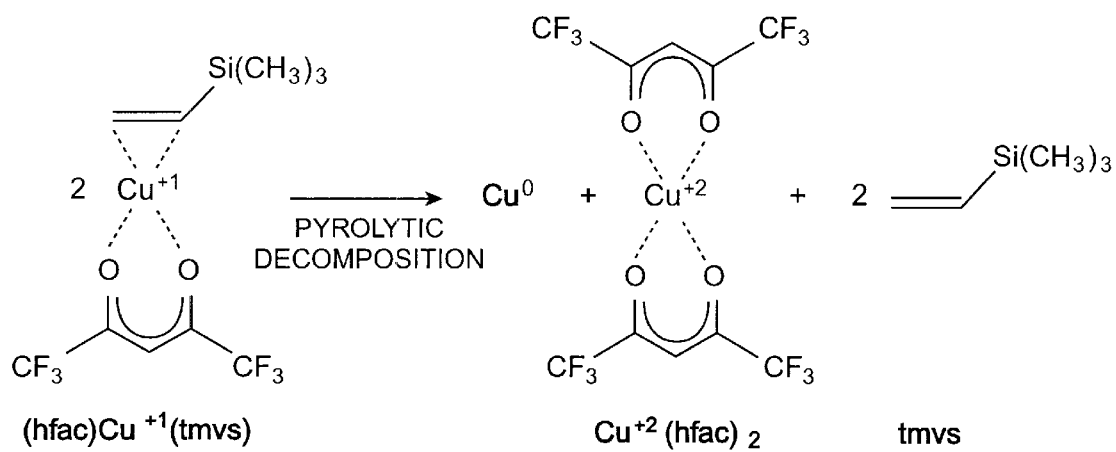
FIG. 3 illustrates the reaction equation of the pyrolytic decomposition of $(hfac)Cu^{+1}(tmvs)$.

Afterwards, heating lamps 18 are turned on, heating the process fluid adhered to the surface of wafer W. This causes (hfac)Cu$^{+1}$(tmvs) contained in said process fluid to pyrolytically decompose, which yields the precipitation of a copper film on the surface of wafer W forming thin film 72 (see FIG. 2D). The pyrolytic decomposition reaction of (hfac)Cu$^{+1}$(tmvs) is as shown in FIG. 3.

During this reaction, the Cu$^{+2}$(hfac)$_2$ and tmvs that are formed are released out of process chamber 12 by an exhaust pump, not shown in the Figures, because they change into their respective gas states because of the temperature inside process chamber 12 during the pyrolytic decomposition reaction. Also due to the temperature, the organic solvent heptadecane is evaporated off of wafer W and released without leaving a trace.

As described above, in this embodiment, since heptadecane, which is an organic solvent, is applied to the surface of wafer W so as for the surface of wafer W to be wet, and a mixed fluid of heptadecane and (hfac)$Cu^{+1}$(tmvs), which is an organometallic compound, is then applied to the surface of wafer W, the organometallic fluid is highly adaptive to the heptadecane so that it spreads over the entire surface and equally flows into holes and trenches. Accordingly, filling in the minute pattern can be performed without any vacancies developing, and without the surface of wafer W being wet, favorable film deposition can be performed better than in the case where the organometallic fluid is directly applied to the surface of wafer W.

Also, since the quality of the deposited film is uniform over the entire surface of wafer W, no part of the film can flake, and its adhesiveness can be improved.

Moreover, in the embodiment described above, since heptadecane, which is the same solvent as that to be used to deposit a film, is used as an organic solvent to make the surface of wafer W wet before the film deposition fluid is applied, the necessary number of equipment such as tanks and pipelines is kept at a minimum and accordingly, costs may be reduced.

It is noted here that in this embodiment, heptadecane is applied to the surface of wafer W, and the process fluid obtained by mixing heptadecane and (hfac)$Cu^{+1}$(tmvs) is then applied to the surface of wafer W; however, the present invention is not limited to this, and only (hfac)$Cu^{+1}$(tmvs) may also be applied after heptadecane is applied.

Furthermore, a mixture of heptadecane, which is an aliphatic saturated hydrocarbon, and (hfac)$Cu^{+1}$(tmvs), which is a copper-ketonato metal complex, added to it is used as the organometallic fluid; alternatively, another copper-ketonato metal complex such as (hfac)$Cu^{+1}$(teovs) may be used as the organometallic compound, and when a film made of another material is deposited, an organometallic compound other than a copper-ketonato metal complex may be used. Furthermore, an aliphatic saturated hydrocarbon such as pentadecane, hexadecane, octadecane, etc. may be used as the organic solvent for copper-ketonato metal complex, and another solvent may be used for an organic metal other than copper-ketonato metal complex. In this case, it is preferable that conditions be met such as: favorable wettability to the material of the under-layer, easy diffusibility of the organometallic compound, and less adverse influence caused by the pyrolytic decomposition reaction.

Moreover, in the embodiment described above, the solvent and the process fluid are supplied through the same line to the wafer; however they may each have separate lines configured for supplying to the wafer.

Furthermore, wafer W is supported on the turntable; however, in cases where a roller pad is used, the supporting means for supporting wafer W is not limited to the turntable, and can be a non-rotatable or stationary one.

Furthermore, the present invention can be used for any apparatus that deposits a film using an organometallic compound, such as a CVD apparatus using a fluid containing an organometallic compound.

INDUSTRIAL APPLICABILITY

According to the present invention, no vacancies can occur in holes and trenches microstructured on a to-be-processed body when depositing a film using a fluid containing an organometallic compound so that an exceedingly superior film can be deposited.

Accordingly, for fabricating semiconductor devices with the recent progressing microstructure, the present invention is especially effective.

What is claimed is:

1. A film deposition method, comprising:

a first step of adhering a solvent, which is used to dissolve an organometallic compound, which precipitates a film deposition material on a to-be-processed body through pyrolytic decomposition reaction;

a second step of adhering a fluid mainly containing said organometallic compound to said to-be-processed body; and a third step of causing pyrolytic decomposition reaction of said organometallic compound contained in the fluid adhered to said to-be-processed body in said second step to occur forming a metal film on said to-be-processed body.

2. The film deposition method according to claim 1, wherein said fluid is made of only said organometallic compound.

3. The film deposition method according to claim 1, wherein said fluid is one that is a mixture of said organometallic compound and said solvent added to it.

4. The film deposition method according to claim 1, wherein wettability of said solvent to a base is better than that of said organometallic fluid.

5. The film deposition method according to claim 1, wherein said organometallic compound is a copper-ketonato metal complex, and said solvent uses an aliphatic saturated hydrocarbon in order to form a copper film.

6. The film deposition method according to claim 1, wherein a step of forming a barrier metal layer on said to-be-processed body is provided before said first step, and said adhering in said first step is performed on said barrier metal film.

7. The film deposition method according to claim 1, wherein said to-be-processed body is a semiconductor wafer.

8. A film deposition apparatus, comprising:

an organometallic fluid adhering means for adhering an organometallic fluid containing an organometallic compound as a main component, which precipitates a film deposition material, to a to-be-processed body by causing a pyrolytic decomposition reaction to occur;

a solvent adhering means for adhering a solvent, which is to dissolve an organometallic compound, to the to-be-processed body; and a control means for controlling said solvent adhering means and said organometallic fluid adhering means so as to adhere a solvent and then adhere an organometallic fluid to said to-be-processed body.

9. The film deposition apparatus according to claim 8, wherein organometallic fluid adhering means includes a mixing means for mixing an organometallic compound and a solvent into an organometallic fluid.

10. The film deposition apparatus according to claim 9, wherein said solvent used for said mixing means shares the solvent used for said solvent adhering means.

* * * * *